United States Patent

Banerjee

(10) Patent No.: US 6,214,638 B1
(45) Date of Patent: Apr. 10, 2001

(54) BOND PAD FUNCTIONAL LAYOUT ON DIE TO IMPROVE PACKAGE MANUFACTURABILITY AND ASSEMBLY

(75) Inventor: Koushik Banerjee, Chandler, AZ (US)

(73) Assignee: Intle Corporation, Santa Clara, CA (US)

( * ) Notice: Subject to any disclaimer, the term of this patent is extended or adjusted under 35 U.S.C. 154(b) by 0 days.

(21) Appl. No.: 09/215,727

(22) Filed: Dec. 18, 1998

Related U.S. Application Data

(62) Division of application No. 08/694,929, filed on Aug. 8, 1996, now Pat. No. 5,895,977.
(51) Int. Cl.[7] .......................... H01L 21/52; H01L 21/56; H01L 21/60
(52) U.S. Cl. ..................... 438/106; 438/121; 438/123; 438/124; 438/125; 438/126; 438/127; 438/117; 438/666; 257/691; 257/697; 257/786
(58) Field of Search ....................... 438/117, 125, 438/616, 666, 106, 121, FOR 369, 124, 126, 127; 257/691, 786, 697

(56) References Cited

U.S. PATENT DOCUMENTS

| | | |
|---|---|---|
| 5,091,772 | 2/1992 | Kohara et al. |
| 5,309,024 | 5/1994 | Hirano . |
| 5,582,242 * | 12/1996 | Hamburgen et al. ................. 257/724 |
| 5,633,785 * | 5/1997 | Parker et al. .......................... 257/532 |
| 5,726,860 * | 3/1998 | Mozdzen ............................. 438/117 |
| 5,734,559 * | 3/1998 | Banerjee et al. ..................... 257/723 |
| 5,811,880 * | 9/1998 | Banerjee et al. ..................... 257/724 |

FOREIGN PATENT DOCUMENTS

| | | |
|---|---|---|
| 60-33746 | 8/1986 | (JP) . |
| 1-191433 | 8/1989 | (JP) . |
| 3-283646 | 12/1991 | (JP) . |

\* cited by examiner

*Primary Examiner*—Mary Wilczewski
(74) *Attorney, Agent, or Firm*—Blakely, Sokoloff, Taylor & Zafman LLP

(57) ABSTRACT

An integrated circuit package which has a staggered bond wire pattern that increases the bond finger width to pad pitch ratio of the package. The package includes a first bond shelf, a second bond shelf and a third bond shelf. Mounted to the package is an integrated circuit which has a plurality of die pads. The die pads are arranged in a pattern of groups, wherein each group has a first die pad that is adjacent to a second die pad, and a third die pad that is adjacent to the second die pad and a first die pad of an adjacent group. Bond wires connect the first die pads to the first bond shelf, the second die pads to the second bond shelf and the third die pads to the third bond shelf, so that each adjacent die pad is connected to a different bond shelf. The staggered bond pattern maximizes the bond finger width of the package.

19 Claims, 1 Drawing Sheet

BOND PAD FUNCTIONAL LAYOUT ON DIE TO IMPROVE PACKAGE MANUFACTURABILITY AND ASSEMBLY

This appln is a Div of Ser. No. 08/694,929 filed Aug. 8, 1996, U.S. Pat. No. 5,895,977.

BACKGROUND OF THE INVENTION

1. Field of the Invention

The present invention relates to an integrated circuit package.

2. Description of Related Art

Integrated circuits are typically enclosed by a package that is mounted to an external printed circuit board. The integrated circuit has a plurality of outer die pads that are connected to corresponding bond fingers of the package. The pads are typically connected to the fingers by wires that are attached with an automated bonding machine.

The bond fingers have a width that is larger than the diameter of the wires to compensate for tolerances in the package, the integrated circuit and the bonding process of the wires. The width of each bond finger is significantly larger than the wire diameter to provide relatively large manufacturing yields for the package. A reduction in the bond finger width typically lowers the yield rate of the package.

The power and digital signals (I/O) of the integrated circuit are limited by the number of die pads that can be constructed on the device. Generally speaking the I/O and power can be increased by either enlarging the size of the integrated circuit or decreasing the spacing between die pads. The spacing is commonly referred to as the pad pitch. Increasing the size of the IC may reduce the yield of the device. Reducing the pitch requires a corresponding reduction in bond finger width which may also reduce the yield of the package. It would be desirable to provide a package that has a relatively low pad pitch but a high package yield rate.

SUMMARY OF THE INVENTION

The present invention is an integrated circuit package which has a staggered bond wire pattern that increases the bond finger width to pad pitch ratio of the package. The package includes a first bond shelf, a second bond shelf and a third bond shelf. Mounted to the package is an integrated circuit which has a plurality of die pads. The die pads are arranged in a pattern of groups, wherein each group has a first die pad that is adjacent to a second die pad, and a third die pad that is adjacent to the second die pad and a first die pad of an adjacent group. Bond wires connect the first die pads to the first bond shelf, the second die pads to the second bond shelf and the third die pads to the third bond shelf, so that each adjacent die pad is connected to a different bond shelf. The staggered bond pattern maximizes the bond finger width of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
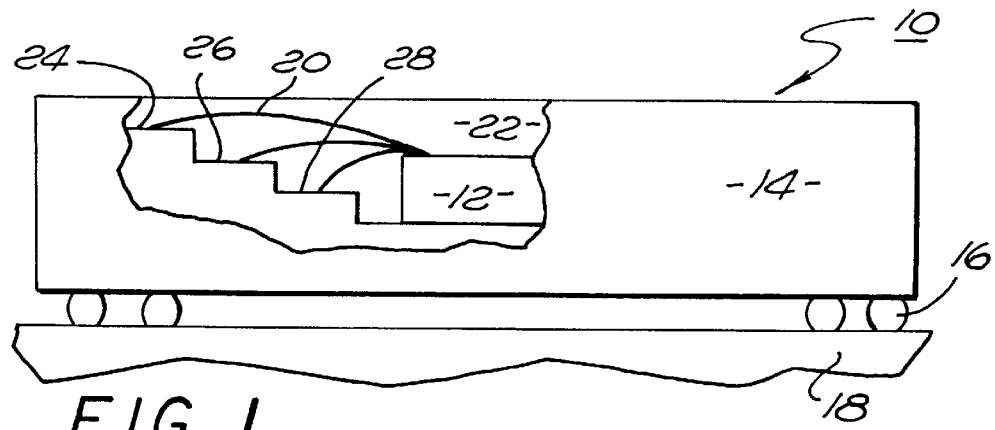
FIG. 1 is a side sectional view of an integrated circuit package.
Figure 2:
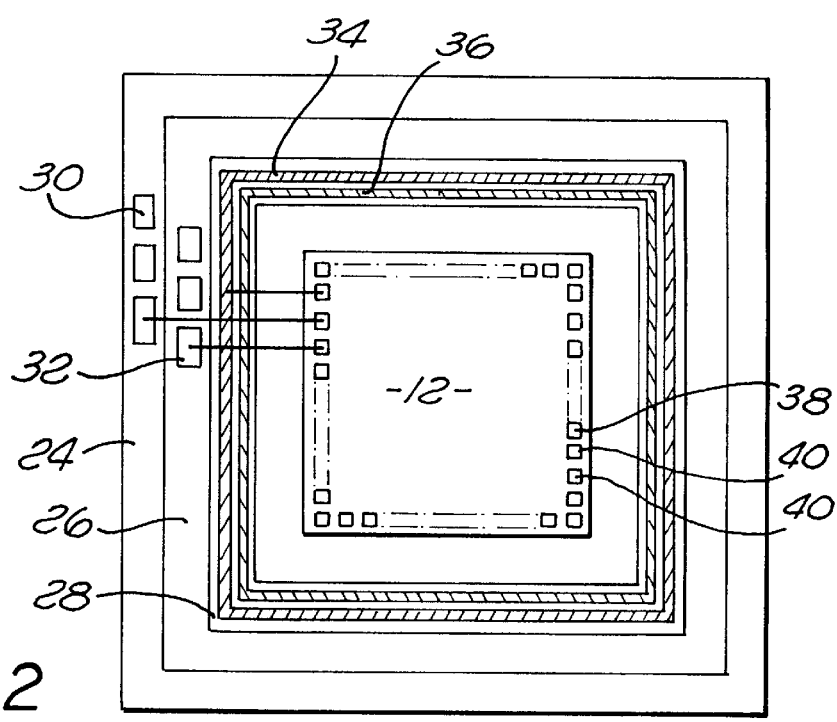
FIG. 2 is a top cross-sectional view of the integrated circuit package.
Figure 3:
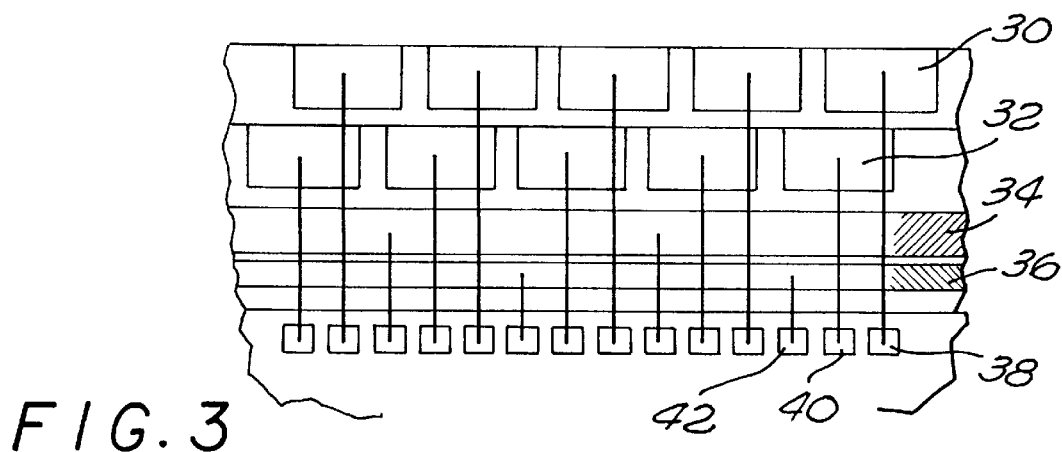
FIG. 3 is an enlarged sectional view showing a wire bond pattern of the present invention.

Referring to the drawings more particularly by reference numbers, FIGS. 1–3 show an integrated circuit package assembly 10. The assembly 10 includes an integrated circuit 12 that is enclosed by an integrated circuit package 14. The integrated circuit 12 may be a microprocessor or any other device. The integrated circuit package 14 has a plurality of external contacts 16 that connect the package 14 to an external printed circuit board 18. The contacts 16 may be solder balls, pins, or any other interconnect means known in the art.

The integrated circuit 12 is coupled to the package 14 by bond wires 20 located in a die cavity 22 of the assembly 10. The package 14 typically contains vias and other internal routing to couple the wire bonds to the external contacts 16 so that the integrated circuit 12 is electrically connected to the external circuit board 18. The package 14 may be constructed from known printed circuit board processes, wherein the die cavity 22 is filled with an encapsulant (not shown) to enclose the integrated circuit 12. Alternatively, the package may be constructed from other processes such as co-fired ceramic.

The package has a first bond shelf 24, a second bond shelf 26 and a third bond shelf 28 that each contain a plurality of surface pads that are connected to the integrated circuit 12 by the wire bonds 20. In the preferred embodiment the first bond shelf 24 has a plurality of first bond fingers 30 and the second bond shelf 26 has a plurality of second bond fingers 32. The third bond shelf 28 preferably has a power ring 34 and a ground ring 36. The power 34 and ground 36 fingers are typically connected to the power and ground busses (not shown) of the external circuit board 18 to provide power to the integrated circuit 12. The bond fingers 30 and 32 are typically connected to the digital signal lines of the circuit board 18 to provide the input/output (I/O) signals of the integrated circuit 12. Some of the bond fingers 30 and 32 may also be connected to peripheral power and ground busses of the package 14 and the circuit board 18.

The integrated circuit 12 has a plurality of die pads 38, 40 and 42 extending along the outer edge of the circuit die. The die pads 38, 40 and 42 are connected to the bond shelves by the bond wires 20. The die pads are arranged into a pattern of groups wherein each group contains a first die pad 38, a second die pad 40 and a third die pad 42. Each first die pad 38 is connected to a first bond finger 30 of the first bond shelf 24. Each second die pad 40 is connected to a second bond finger 32 of the second bond shelf 26. Each third die pad 42 is connected to either the power ring 34 or ground ring 36 of the third bond shelf 28.

The bond finger pattern is staggered so that each adjacent die pad is connected to an adjacent bond shelf of the package in a pattern that will be referred to as the 2:1 rule. The 2:1 rule is derived from an industry design guideline which states that it is preferred there should be two I/O pads for each power/ground pad, although it is to be understood that the present invention does not require a ratio of 2 I/O pads for each power/ground pad. The staggered interconnect pattern allows the space between adjacent bond fingers to be 3 times the pitch of the die pads. This is to be distinguished from the prior art wherein the bond finger pitch is 2 times the pitch of the die pads. The additional space between the bond fingers allows wider fingers to be formed on the package.

The table below shows the increase in bond finger width for a given die pad pitch.

| Bond Pad Pitch | Bond-finger width without 2:1 | Bond-finger width with 2:1 |
| --- | --- | --- |
| 85 micron | (2*85) − 50 = 120 micron | (3*85) − 50 = 205 micron |
| 80 micron | (2*80) − 50 = 110 micron | (3*80) − 50 = 190 micron |
| 70 micron | (2*70) − 50 = 90 micron | (3*70) − 50 = 160 micron |

The wider fingers decrease the difficulty of assembling the package and increase the yield of the final product.

In the preferred embodiment, the first die pad 38 is a first input/output pin, the second die pad 40 is a second input/output pin and the third die pad 42 is either a power pin or a ground pin. The die pads of the integrated circuit 12 are preferably arranged into two groups of die pads. One group of die pads contains two I/O pins and a power pin. The second group of die pads contains two I/O pins and a ground pin. Although groups containing two I/O pins and a single power/ground pin are shown and described, it is to be understood that a group may have one I/O pin and two power/ground pins, particularly for a package that provides peripheral power such as a dual power supply. Alternatively, the integrated circuit 12 may contain blank die pads to preserve the staggered bond wire pattern of the present invention. Although three bond shelves are shown and described, it is to be understood that four or more shelves may be used. By way of example, in a four bond shelf package the die pads may be sequentially connected to the first shelf, second shelf, third shelf, fourth shelf, first shelf, second shelf and so forth and so on.

The package assembly 10 is assembled by initially mounting the integrated circuit 12 to the package 14. The bond wires are then attached to the die pads and bond fingers, typically with an automated wire bonding machine. Although wire bonds are shown and described, it is to be understood that the die pads could be attached to the bond shelves with a tape automated bonding (TAB) tape. After testing, the die cavity 22 is filled with encapsulant to enclose the integrated circuit 12. The package 14 can then be mounted to the external circuit board 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for connecting an integrated circuit to a package, comprising:
   a) providing a package that has a first bond shelf, a second bond shelf and a third bond shelf;
   b) mounting an integrated circuit to said package, wherein said integrated circuit has a plurality of die pads, said die pads being arranged in a pattern of groups which each include a first die pad that is adjacent to a second die pad, and a third die pad that is adjacent to said second die pad and a first die pad of an adjacent group; and,
   c) coupling said first die pads to said first bond shelf, said second die pads to said second bond shelf, and said third die pads to said third bond shelf.

2. The method as recited in claim 1, wherein said die pads are coupled to said bond shelves by a plurality of bond wires.

3. A method for connecting an integrated circuit to a package, comprising:
   a) providing a package that has a plurality of first bond fingers on a first bond shelf, a plurality of second bond fingers on a second bond shelf, and a power ring and a ground ring on a third bond shelf;
   b) mounting an integrated circuit to said package, wherein said integrated circuit has a plurality of die pads, said die pads being arranged in a pattern having a first group and a second group, wherein said first group includes a first input/output die pad that is adjacent to a second input/output die pad, and a power die pad that is adjacent to said second input/output die pad, said second group includes a first input/output die pad that is adjacent to a second input/output die pad and a ground die pad that is adjacent to said second input/output pad; and,
   c) coupling said first input/output die pads to said first bond fingers, said second input/output die pads to said second bond fingers, said power die pad to said power ring, and said ground die pad to said ground ring.

4. The method as recited in claim 3, wherein said die pads are coupled to said bond fingers and said rings by a plurality of bond wires.

5. A method comprising:
   providing a package including a first bond shelf, a second bond shelf and a third bond shelf;
   mounting an integrated circuit to said package, said integrated circuit including a plurality of pads arranged in a pattern of groups, each group including a first die pad, a second die pad adjacent to said first die pad, and a third die pad adjacent to said second die pad and a first die pad of an adjacent group; and
   coupling said first die pad to said first bond shelf, said second pads to said second bond shelf and said third pads to said third bond shelf.

6. The method of claim 5, wherein said bond shelf includes a plurality of first bond fingers.

7. The method of claim 6, wherein each of the plurality of first bond fingers correspond to one of the said first die pads.

8. The method of claim 6, wherein a spring between said plurality of first bond fingers is three times a pitch of said first die pads.

9. The method of claim 5, wherein said second bond shelf includes a plurality of second bond fingers.

10. The method of claim 9, wherein each of the plurality of second bond fingers correspond to one of the said second die pads.

11. The method of claim 5, wherein said third bond shelf includes a power ring.

12. The method of claim 11, wherein said third bond shelf further includes a ground ring.

13. The method of claim 12, wherein each of said third die pads is coupled to one of said power ring and said ground ring.

14. The method of claim 5, wherein a first group of die pads includes two input/output (I/O) pins and a ground pin.

15. The method of claim 14, wherein a second group of die pads adjacent to said first group of pads includes two I/O pins and a power pin.

16. The method of claim 5, wherein each group of die pads includes at least two input/output (I/O) pins and at least one of either a ground pin or a power pin.

17. A method comprising:

providing an integrated circuit including a plurality of die pads arranged in a pattern of groups, a first group including a first die pad, a second die pad adjacent to said first die pad, and a third die pad adjacent to said second die pad and a first die pad of a second group;

coupling said first die pad to a first bond shelf of a package;

coupling said second die pad to a second bond shelf of said package; and coupling said third die pad to a third bond shelf of said package.

18. The method of claim 17, wherein said first bond shelf includes a plurality of first bond fingers.

19. The method of claim 17, wherein at least one of the plurality of first bond fingers is coupled to said first die pad and the plurality of first bond fingers corresponds in number to said first die pads.

\* \* \* \* \*

UNITED STATES PATENT AND TRADEMARK OFFICE
CERTIFICATE OF CORRECTION

PATENT NO. : 6,214,638 B1  Page 1 of 1
DATED : April 10, 2001
INVENTOR(S) : Banerjee et al.

It is certified that error appears in the above-identified patent and that said Letters Patent is hereby corrected as shown below:

Title page,
Item [73], Assignee, delete "Intle", insert -- Intel --.

Signed and Sealed this

Seventh Day of May, 2002

Attest:

JAMES E. ROGAN
Attesting Officer  Director of the United States Patent and Trademark Office